(12) United States Patent
Dalton et al.

(10) Patent No.: US 6,960,519 B1
(45) Date of Patent: Nov. 1, 2005

(54) INTERCONNECT STRUCTURE IMPROVEMENTS

(75) Inventors: Timothy J. Dalton, Ridgefield, CT (US); John A. Fitzsimmons, Poughkeepsie, NY (US); Jeffrey P. Gambino, Westford, VT (US); Lee M. Nicholson, Katonah, NY (US); Andrew H. Simon, Fishkill, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,210

(22) Filed: Jun. 25, 2004

(51) Int. Cl.[7] .............................................. H01L 21/44
(52) U.S. Cl. ..................................... 438/617; 438/652
(58) Field of Search ............................... 438/617, 627, 438/636, 643, 648, 652, 661, 668

(56) References Cited

U.S. PATENT DOCUMENTS

| | | | |
|---|---|---|---|
| 5,818,111 A * | 10/1998 | Jeng et al. | 257/776 |
| 6,156,646 A * | 12/2000 | Ishihara | 438/652 |
| 6,180,490 B1 | 1/2001 | Vassiliev et al. | |
| 6,274,483 B1 | 8/2001 | Chang et al. | |
| 6,441,494 B2 * | 8/2002 | Huang et al. | 257/774 |
| 6,528,400 B2 | 3/2003 | Fukada et al. | |
| 6,540,885 B1 | 4/2003 | Keil et al. | |
| 6,613,664 B2 | 9/2003 | Barth et al. | |
| 6,661,054 B1 | 12/2003 | Nakamura | |
| 6,663,787 B1 | 12/2003 | You et al. | |

* cited by examiner

*Primary Examiner*—Phuc T. Dang
(74) *Attorney, Agent, or Firm*—DeLio & Peterson, LLC; Kelly M. Nowak; Joseph P. Abate

(57) ABSTRACT

Methods and conductive interconnect structures are provided for preventing cracks in a dielectric layer on a substrate. Substantially half cylindrical or cylindrical trench openings are formed within at least one dielectric layer, which are then filled with a high conductivity metal for forming substantially half cylindrical or cylindrical wires. The rounded bottom portions of the substantially half cylindrical wires, or the rounded bottom and top portions of the substantially half cylindrical wires, avoid any propagation points for starting cracks in the dielectric layer, as compared to conventional rectangular conductors having angled edges, which in fact are propagation points for initiating cracks. The substantially half cylindrical or cylindrical wires also reduce the line-to-line capacitance between neighboring wires, substantially eliminate any high stress points in the dielectric layer, reduce mechanical stresses induced on the IC and increase the overall mechanical strength of the IC.

17 Claims, 7 Drawing Sheets

INTERCONNECT STRUCTURE IMPROVEMENTS

BACKGROUND OF INVENTION

The present invention relates to semiconductor devices, and more particularly, to methods of forming and the resultant structures formed having cylindrical or substantially cylindrical wires for reducing both induced mechanical stresses on the structure and the line-to-line capacitance.

Integrated circuits (ICs) are fabricated by building multiple layers of wiring and passivation on substrates (wafers) that contain semiconductor devices. Often, interconnect metal conductive layers are connected to each other, and to the substrate, by patterned insulative layers residing over and under such interconnect metal conductive layers. These insulative layers are commonly composed of a dielectric material. The openings, such as trenches and vias, are etched into the insulative layers, by damascene or dual damascene processing, in locations where conductive wires or contacts are desired between conductive regions. These conductive regions may include previously deposited patterned metal layers, or conductive substrate layers underlying the insulative layer and metal patterns deposited on the insulative layer. The openings are then filled with metallization to form the conductors for electrically connecting devices located on different metallization levels of the IC.

In the fabrication of ICs, the insulative layers are often composed of dielectric materials having low dielectric constants. However, as the dielectric constant (low-k) of the material is lowered, the insulator material becomes mechanically weaker, and as such, it becomes significantly easier to crack or damage these low-k dielectric materials. The susceptibility of cracking and damage to low-k-dielectric materials increases, for example, as a result of the temperature cycling and/or temperature/humidity stressing of the IC. The presence of device interconnects, such as filled vias and/or rectangular trenches within the low-k dielectric layers, further increase stresses on the dielectric layer, which in turn, increase its susceptibility to cracking and damage. For instance, during sintering, stresses are primarily built up in the dielectric layer during the cool down cycle, whereby the dielectric layer is put into tension near any metal feature, making it prone to failure by cracking. This problem is most acute near the vias.

Referring to FIGS. 1A–1B, rectangular trench openings 12 are commonly formed by patterning and etching insulative layers, such as dielectric layer 10. These rectangular trench openings 12 extend horizontally into the dielectric layer 10, such that once filled with metallization, horizontal conductors, i.e. wires, have been formed by the horizontally applied patterns. However, as is shown, both the upper corners 14 and lower corners 16 of the rectangular trench opening 12 are formed at substantially 90° angles. It is these 90° angled corners 14 and 16 that increase the stresses on the dielectric layer, and thus increase susceptibility of the low-k dielectric layer to cracking or damage.

FIG. 1B shows the sharp 90° angled corners 14 may be eliminated by concaving downward the upper corners 14 to result in substantially flattened upper recessed corners 18 of trench 13. This is generally accomplished by a physical sputtering process, whereby the 90° angled corners 14 are roughened during the sputter processing, such that portions of the upper corners 14 are removed and the recessed corners 18 formed. This sputtering yield cross section is a function of the desired angle at the recessed corners 18, with a maximum angle of 45° at the upper recessed corners 18, as shown in FIG. 1B.

However, in recessing the upper 90° angled corners 14, the lower corners 16 remain at substantially 90° angles within trench 13. Thus, these 90° angled lower corners 16 continue to be propagation and nucleation points for potential cracks within the dielectric layer 10. Further, once trench 13 is filled with metallization, the wire formed remains to have a substantially rectangular cross-section shape. As circuit densities continually decrease for advanced logic and memory chips, the device and wire dimensions are scaled down, while the chip size is being increased. These more densely populated circuits are requiring that the rectangular wires be placed closer together, thus increasing the wiring capacitance between adjacent wires. That is, the capacitively coupled noise between neighboring rectangular shaped lines will become very severe. In addition, when the upper trench corners are rounded concave downward, the occurrence of undesired wire shorts between adjacent trenches increases, due to residual metal, which degrades the IC yield and/or reliability.

The trench opening may be formed with a microtrenched profile 31 (FIG. 2A), a slightly rounded bottom profile 33 (FIG. 2B), or alternatively, the microtrenched profile 31 and the slightly rounded bottom profile 33 may be processed together such that a flat bottom trench profile 35 is formed (FIG. 2C) in a rectangular trench opening 22, which has upper 24 and lower 26 corners at substantially 90° angles. However, once the trench openings of FIGS. 2A–2C are filled with metallization, the conductors form all substantially in the shape of rectangular parallelepipeds. Each of these rectangular parallelepipeds have at least one sharp corner and/or a flat edge, and as such, suffer from the above problems of propagation and nucleation points for potential cracks within the dielectric layer 10, as well as increased capacitively coupled noise between neighboring rectangular parallelepiped conductors.

Therefore, a need continues to exist in the art for improved methods and interconnect structures that significantly eliminate the problems of propagation and nucleation points for potential cracks within a low-k dielectric layer associated with substantially rectangular conductors, as well as reduce capacitively coupled noise between neighboring conductors.

SUMMARY OF INVENTION

Bearing in mind the problems and deficiencies of the prior art, it is therefore an object of the present invention to provide methods and interconnect structures that significantly eliminate the problems of propagation and nucleation points for potential cracks within a low-k dielectric layer by providing cylindrical, substantially cylindrical or substantially half cylindrical conductors within the low-k dielectric layer.

Another object of the present invention is to provide methods and the interconnect structures formed having cylindrical, substantially cylindrical or substantially half cylindrical conductors in a low-k dielectric layer which significantly reduce capacitively coupled noise between neighboring cylindrical, substantially cylindrical or substantially half cylindrical conductors.

Yet another object of the present invention is to provide methods and the interconnect structures formed having cylindrical, substantially cylindrical or substantially half cylindrical conductors that reduce the potential for damascene trench upper corner shorts, or near shorts to adjacent trenches, by changing the upper trench corner profile to an arched concave upward, or rounded, shape.

It is yet another object of the present invention to provide methods and the interconnect structures formed having cylindrical, substantially cylindrical or substantially half cylindrical conductors for increasing the overall mechanical strength in the interconnect structure, as well as reduce the stresses induced by the structure.

A further object of the invention is to provide methods and the interconnect structures formed having cylindrical, substantially cylindrical or substantially half cylindrical conductors which reduce the high stress points within the low-k dielectric layer.

It is another object of the present invention to provide strong, reliable and efficient integrated circuits having cylindrical, substantially cylindrical or substantially half cylindrical wires within a low-k dielectric layer.

Still other objects and advantages of the invention will in part be obvious and will in part be apparent from the specification.

The above and other objects, which will be apparent to those skilled in art, are achieved in the present invention, which is directed to a method of forming substantially cylindrical conductors. The method includes providing an intermetal dielectric layer, depositing a hard mask layer over the intermetal dielectric layer and etching an opening in the hard mask layer in a location corresponding to where a substantially half cylindrical wire is to be formed. The intermetal dielectric layer is then etched, in a location corresponding to such opening, at a substantially constant rate to form a substantially half cylindrical trench opening in the intermetal dielectric layer that has dimensions larger in comparison to dimensions of the opening in the hard mask layer. A high conductivity metal fills this substantially half cylindrical trench opening to form the substantially half cylindrical wire in the intermetal dielectric layer. The opening in the hard mask layer has a width "w1" and the substantially half cylindrical trench opening has a depth "d" and a largest width "w2", the largest width "w2" being a function of the opening in the hard mask layer represented as "w2"="w1"+(2)(d).

Preferably, the intermetal dielectric layer comprises a low-k intermetal dielectric layer. As such, the intermetal dielectric layer may be a $SiO_2$-based intermetal dielectric layer or an organic polymer intermetal dielectric layer. $SiO_2$-based intermetal dielectric layers may be etched using an aqueous dilute HF or a vapor HF, while organic polymer intermetal dielectric layers may be etched using an $H_2$, $N_2$, $O_2$, He and/or Ar plasma. Optionally, prior to isotropically etching these intermetal dielectric layers, the intermetal dielectric layer may be initially etched to obtain a substantially vertical trench profile having a desired trench depth of the substantially half cylindrical trench opening for enhanced formation thereof. The hard mask layer may be composed of $SiC_x$, $SiC_xN_y$, or $SiN_x$, and optionally, a liner layer may be deposited prior to deposition of the metal fill.

Once the substantially half cylindrical wire is formed, any remaining hard mask layer may be removed and then a portion of the intermetal dielectric layer at least in a location surrounding the substantially half cylindrical wire is removed. This exposes a top surface of the substantially half cylindrical wire. The exposed top portion of the substantially half cylindrical wire is then etched such that it is transformed into a substantially cylindrical wire. Additional dielectric material may then be deposited to at least encapsulate the substantially cylindrical wire.

In another aspect, the invention is directed to a method of forming substantially cylindrical conductors that includes providing a first intermetal dielectric layer, providing at least a second intermetal dielectric layer over the first intermetal dielectric layer and depositing a hard mask layer over the at least second intermetal dielectric layer. An opening is etched into the hard mask layer in a location corresponding to where a substantially cylindrical wire is to be formed. Sequentially, the second and first intermetal dielectric layers are etched to form a substantially cylindrical trench opening traversing through the second intermetal dielectric layer and extending into the first intermetal dielectric layer. The substantially cylindrical trench opening has dimensions larger in comparison to dimensions of the opening in the hard mask layer. This substantially cylindrical trench opening is then filled with a high conductivity metal to form the substantially cylindrical wire.

In forming the substantially cylindrical trench opening, a third intermetal dielectric layer may be provided over the second intermetal dielectric layer. In so doing, the second intermetal dielectric layer selectively etches faster than the first and third intermetal dielectric layers so that the etch front partially undercuts bottom corner portions of the second intermetal dielectric layer for forming the substantially cylindrical trench opening. This may be accomplished by varying dopant concentrations of these intermetal dielectric layers, or providing porous intermetal dielectric layers having varying amounts of porosity. Alternatively, the at least second dielectric layer may be a graded dielectric layer having at least one constituent element thereof varied in concentration in a manner that allows the graded dielectric layer etch slowest at a top surface and fastest at a bottom surface thereof for forming the substantially cylindrical trench opening.

In yet another aspect, the invention is directed to a conductive interconnect structure for preventing cracks in a dielectric layer on a substrate. The conductive interconnect structure includes at least a first intermetal dielectric layer and a substantially cylindrical trench opening therein. The substantially cylindrical trench opening is filled with a high conductivity metal such that a substantially cylindrical wire is formed in the at least first intermetal dielectric layer. This substantially cylindrical wire substantially avoids any propagation points for starting cracks in the at least first intermetal dielectric layer. The conductive interconnect structure may also include at least a second intermetal dielectric layer, whereby the substantially cylindrical wire resides in both the first and the at least second intermetal dielectric layers.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 3A–5C of the drawings in which like numerals refer to like features of the invention.

The present invention provides methods of forming and the interconnect structures (IC) formed having half cylindrical, substantially cylindrical, or cylindrical conductors, preferably wires. These half cylindrical, substantially cylindrical, or cylindrical wires advantageously reduce the line-to-line capacitance between neighboring conductors, reduce mechanical stresses induced on the IC, and as such, increase the overall mechanical strength of the IC. It should be appreciated that the wires of the present invention, with half cylindrical or cylindrical cross-sectional shapes, are understood to be nearly or approximately shaped as described and not ideal geometric half cylinders or cylinders.

As the conductors of the invention are formed with half cylindrical, substantially cylindrical, or cylindrical shapes, the substantially or entirely rounded cross-sectional circumference of these conductors significantly avoids any propagation or nucleation points for starting cracks in the dielectric layer, as compared to conventional rectangular conductors having angled edges, which in fact are propagation and nucleation points for initiating cracks in dielectric layers. That is, the cylindrical or nearly cylindrical shapes of the conductors of the invention avoid those conductors having significantly angled edges, and thereby appreciably eliminate any high stress points in the dielectric layer.

Also, as a result of the substantially or entirely rounded cross-section of the present conductors, capacitively coupled noise between neighboring cylindrical or substantially cylindrical conductors is significantly reduced in comparison to conventional rectangular conductors of the same cross sectional volume. That is, wherein conventional neighboring rectangular conductors and the present cylindrical or substantially cylindrical conductors have the same cross sectional volume, and hence same resistance per unit length, neighboring rectangular conductors will have a higher capacitance per unit length due to the field lines traveling a shorter distance between neighboring rectangular conductors, as compared to the distance traveled between neighboring cylindrical or substantially cylindrical conductors, which travel a longer distance and therefore have a lower capacitance per unit length.

Figure 1A:
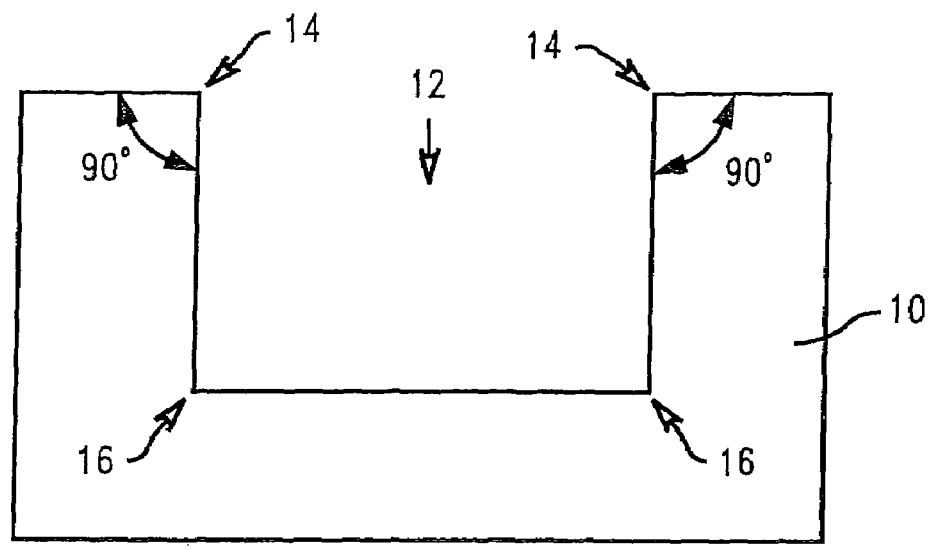
FIGS. 1A–1B are prior art cross-sectional illustrations of a conventional process for forming a substantially rectangular conductor.
Figure 1B:
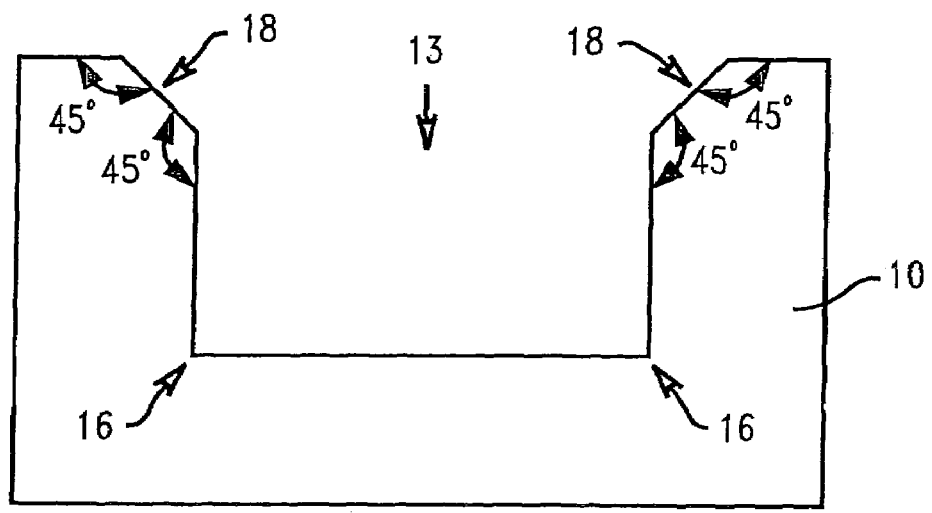
Figure 2A:
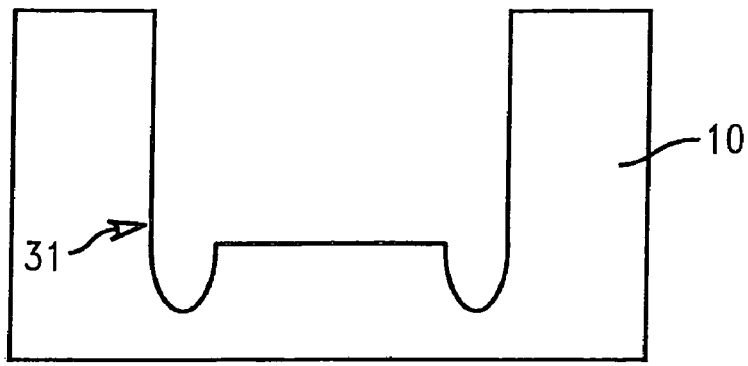
FIGS. 2A–2C are prior art cross-sectional illustrations of conventional via openings for forming substantially rectangular parallelepiped conductors.
Figure 2B:
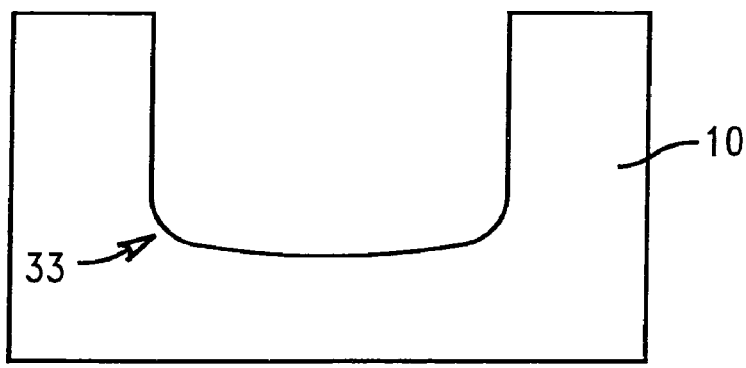
Figure 2C:
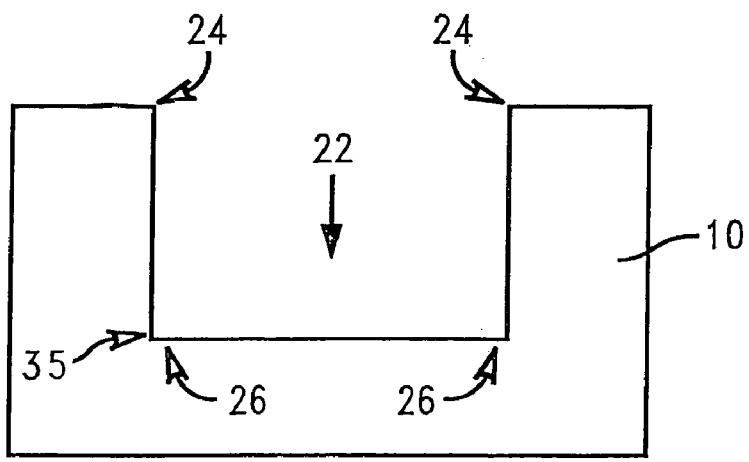
Figure 3A:
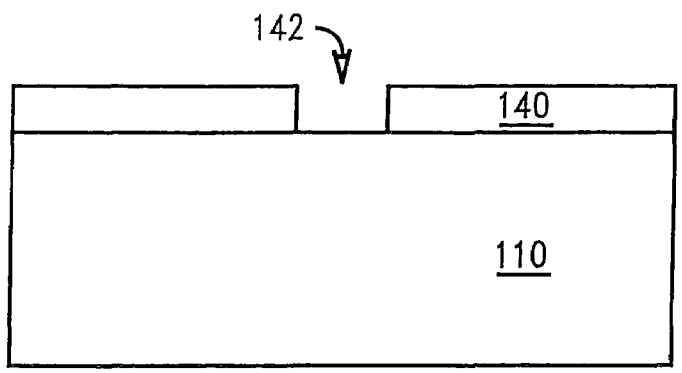
FIGS. 3A–3D are cross-sectional illustrations of process steps of the invention for forming substantially half cylindrical wires.

In accordance with the invention, a substantially half cylindrical wire is shown in FIGS. 3A–D having a substantially rounded bottom. Referring to FIG. 3A, an intermetal dielectric layer 110, preferably a low-k dielectric layer, is provided with a hard mask layer 140 over a surface thereof by known techniques. The intermetal dielectric layer 110 may include, but is not limited to, a fluorosilicate glass (FSG) intermetal dielectric, a SiLK™ intermetal dielectric, SiCOH, Methylsilsesquoixane (MSQ), and the like, including porous versions of these dielectrics, deposited on the wafer using one or more known methods, such as plasma-enhanced chemical vapor deposition (PECVD), sub-atmospheric chemical vapor deposition (SACVD), atmospheric pressure chemical vapor deposition (APCVD), and spin-on. Optionally, the intermetal dielectric layer 110 may be subjected to a cure step, depending upon the material it is composed of, such as, but not limited to furnace annealing, plasma curing, UV curing, electron beam cure and the like. The hard mask 140, may be deposited using methods similar to those used to deposit intermetal dielectric layer 110.

A critical aspect of the invention is that the hard mask layer 140 be composed of a material that etches significantly slower than the underlying intermetal dielectric layer 110, has sufficient mechanical strength for adhesion to the intermetal dielectric layer 110, as well as to any subsequently deposited layers, and has sufficient dielectric properties, such as for dielectric breakdown. The resist mask is patterned and etched as known in the art to form openings 142 in locations corresponding to where wire trenches are to be etched in the dielectric layer 110. Preferably, the opening 142 has a width "w" that is smaller in diameter than the desired wire trench opening to be subsequently etched, most preferably, the width "w1" of opening 142 is less than one half (½) the largest diameter width "w2" of wire opening 112 shown in FIG. 3B.

In achieving wire opening 112 in the intermetal dielectric layer 110, having a width greater than the width of opening 142 in the hard mask layer, the portion of the intermetal dielectric layer 110 exposed at the bottom of opening 142 is isotropically or substantially isotropically etched selective to the hard mask layer 140. An essential feature of the invention is that the etch rate of the intermetal dielectric layer 110 be substantially constant, or the same, throughout the intermetal dielectric layer 110, in all locations where etchant contacts the intermetal dielectric layer 110. This advantageously results in a circular or substantially circular etch front for forming the half cylindrical or cylindrical wire trenches of the invention.

In accordance with the invention, for a $Si_wC_xO_yH_z$ based intermetal dielectric layer wherein w, x, y and z range from about 0–1, such as a $SiO_2$-based intermetal dielectric 110, the isotropic etch of the invention may be accomplished using an aqueous dilute HF or vapor HF etch. For example, wherein the intermetal dielectric layer 110 comprises a FSG intermetal dielectric, a $SiC_x$, $SiC_xN_y$, or $SiN_x$ hard mask layer 140 may be provided thereover, the opening 142 formed therein, and then exposed FSG intermetal dielectric material is etched using an isotropic dilute HF (DHF) etchant to provide the half rounded trench opening 112. If the upper layers of hard mask 140 are sacrificial, they can be composed of refractory metals or alloys. Wherein the intermetal dielectric 110 is etched using an aqueous dilute HF process, a water dilution ranging from, but not limited to, about 5:1 to 200:1 is preferably employed, with an optimal dilution of about 20:1.

For organic polymer intermetal dielectrics 110 (e.g. SiLK™, porous SiLK™, the isotropic etch can be performed using an $H_2$, $N_2$ Or $O_2$ plasma. For example, wherein the intermetal dielectric layer 110 comprises SiLK™ with one or more of $SiC_x$, $SiC_xN_y$, $SiN_x$, $SiO_2$ or SiCOH, hard mask layer 140 thereover, opening 142 is etched in the hard mask layer 140, and then the exposed SiLK™ material is etched using an isotropic $N_2$ reactive ion etching to form the half rounded trench opening 112.

Optionally, prior to etching the intermetal dielectric layer 110 to form the half rounded trench opening 112 therein, the half rounded trench opening 112 may be initially anisotropically etched to obtain a desired trench depth of the trench opening 112 with rectangular profiles. For $SiO_2$-based dielectrics, including, but not limited to, $SiO_2$, FSG, or SiCOH, this etch step may be accomplished using a perfluorocarbon- or hydrofluorocarbon-based RIE. Alternatively, for organic polymer dielectrics, including, but not limited to, SiLK™ or porous SiLK™, this anisotropically etch step for obtaining the desired depth of the trench opening 112 may be accomplished using an $O_2$, $N_2$ or $H_2$-based RIE. During the step of anisotropically etching the intermetal dielectric layer 110, polymers are formed on the trench sidewalls resulting in the conventional vertical or substantially vertical trench profiles. The isotropic etch step of the invention immediately follows this anisotropic etch step to further etch the intermetal dielectric layer 110 having vertical or substantially vertical trench profiles to advantageously form the substantially half rounded trench opening 112 of the invention shown in FIG. 3B.

Figure 3B:
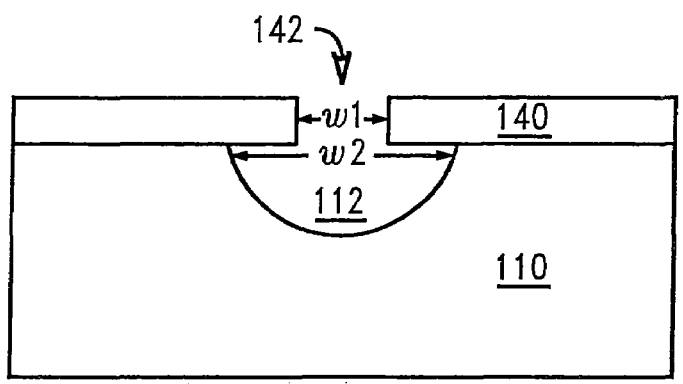
Figure 3C:
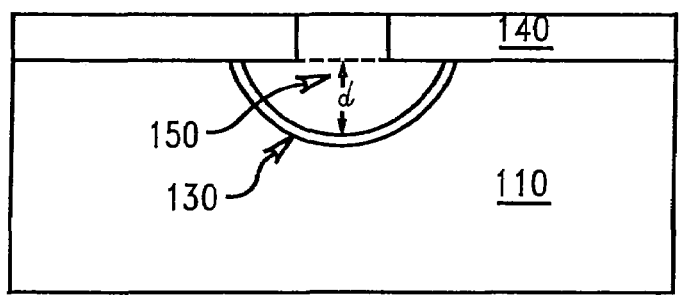

A critical feature of the present invention is the smaller opening 142 having width "w1" in hard mask layer 140 used in combination with the isotropic etch for forming the substantially half rounded trench opening 112 with the desired width and depth. Referring to FIGS. 3B–3C, once opening 112 is filled with metallization to form the resultant substantially half cylindrical wire, the width of this wire is approximately equal to the width of opening 112 "w1" plus two (2) times the etch depth of opening 112, i.e., "w2"="w1"+(2)(d).

Upon completion of the half rounded trench opening 112, the wafer may be cleaned by known techniques prior to subsequent processing in accordance with the invention, such as using wet chemical cleans, anneals, sputter cleans, and the like. A liner 130, preferably of a refractory metal, may then optionally be conformally deposited within the half rounded trench opening 112. This may be accomplished by depositing a conformal layer by atomic layer deposition (ALD), chemical vapor deposition (CVD), or sputtering such that all exposed surfaces of the intermetal dielectric layer 110 within the half rounded trench opening 112 are coated with the liner 130. The liner layer 130 may include, but is not limited to, one or more of Ta, TaN, WN, Ru and the like. Optionally, in achieving the void free or substantially void free copper fill of the substantially cylindrical or half cylindrical trenches of the invention, a thin copper seed layer 133 may be deposited to coat the liner layer 130. Thin copper seed layer 133 may be deposited prior to providing the copper fill 150 by sputtering, CVD, ALD and the like.

Once the optional liner layer 130 and/or thin copper seed layer 133 coat the exposed surfaces of dielectric layer 110 within opening 112, remaining empty portions of half rounded via opening 112 are preferably filled with a high conductivity metal, such as copper, to form the substantially half cylindrical conductor, i.e., wire. In so doing, a metal material, such as, but not limited to, copper is deposited over the structure of FIG. 3B such that copper fills the half rounded trench opening 112 and coats the surface of the hard mask layer 140. The copper fill 150 is then electroplated to form the substantially half cylindrical wires. Alternative high conductivity metals include AlCu and Ag. Any excess copper fill is then removed from the wafer, particularly from the surface of the hard mask layer 140. This may be accomplished by known techniques including, for example, chemical mechanical polishing, planarization, and the like. In removing any excess copper fill, this removal step may stop once the top surface of the hard mask layer 140 is reached thereby leaving remaining portions of the high conductivity metal material residing between adjacent portions of the hard mask layer 140, as is shown in FIG. 3C. Alternatively, excess copper fill may be removed such that the removal step continues the top surface of the dielectric layer 110 is reached, thereby removing the hard mask layer 140 and remaining portions of the high conductivity metal material residing between adjacent portions of the hard mask layer 140, resulting in the structure of FIG. 3D. Copper fill 150 then remains within the half rounded trench opening 112 and between remaining portions of hard mask layer 140 (FIG. 3C), or remains only within the half rounded trench opening 112 (FIG. 3D).

Figure 3D:
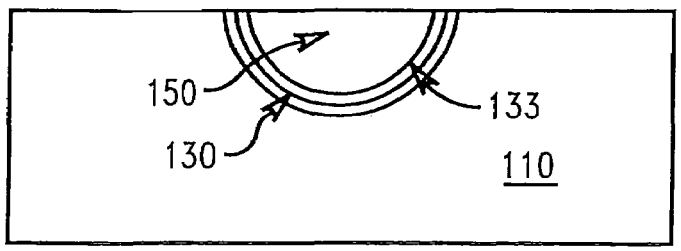
Figure 3E:
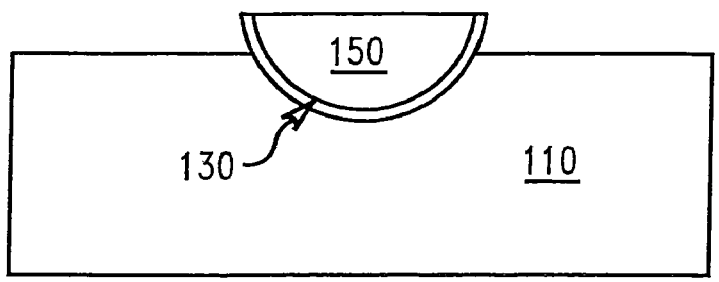
FIGS. 3E–3G are cross-sectional illustrations of process steps of the invention for forming substantially cylindrical wires from the substantially half cylindrical wires of FIGS. 3A–3D.
Figure 3F:
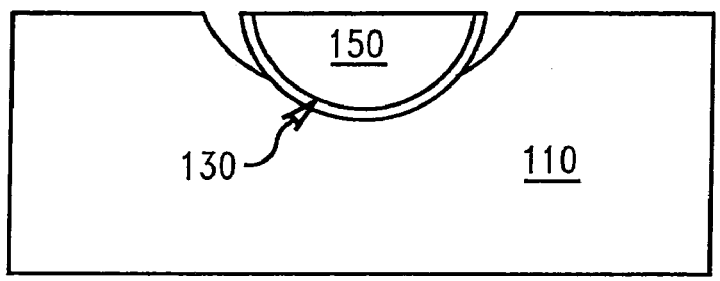
Figure 3G:
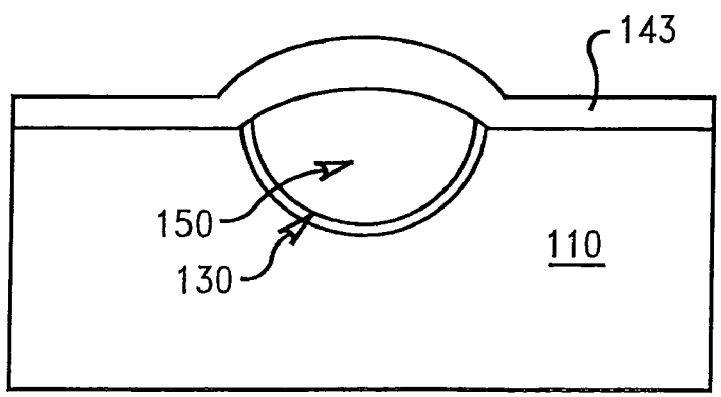

In accordance with the invention, the substantially half cylindrical wires shown in FIGS. 3C and 3D may be further processed for forming substantially cylindrical wires. Wherein the hard mask layer 140 remains over portions of the substantially half cylindrical wire and the dielectric layer 110, as shown in FIG. 3C, such hard mask layer 140 is removed by known techniques to expose a top surface of the substantially half cylindrical wire and the dielectric layer 110, and hence result in the structure of FIG. 3D. The structure of FIG. 3D is then further processed by partially etching a portion of the dielectric layer 110 so that the upper half of the substantially half cylindrical wire is exposed. This may be accomplished by conformally etching the dielectric layer 110 for removing a portion of the dielectric layer's thickness, as is shown in FIG. 3E, or alternatively, it may be accomplished by etching only a portion of the dielectric layer 110 that resides adjacent the upper half of the substantially half cylindrical wire to form a furrow therearound the top half of such wire, as shown in FIG. 3F. The exposed upper half of the substantially half cylindrical wire is then etched, such as by a sputter process, for rounding the top corners of such upper half of the substantially half cylindrical wires for forming a substantially cylindrical wire, as is shown in FIG. 3G. Additional dielectric material 143 is then deposited over a surface of the structure, to form a dielectric layer or fill the furrow, in an amount sufficient to encapsulate the substantially cylindrical wires. Optionally, a refractory metal layer may be selectively deposited on exposed surface areas of the copper material 150 of the substantially cylindrical wire to passivate such surface area prior to depositing the encapsulating dielectric layer. For example, a W layer may be deposited by CVD, or a CoWP layer may be deposited by electroless plating.

Figure 4A:
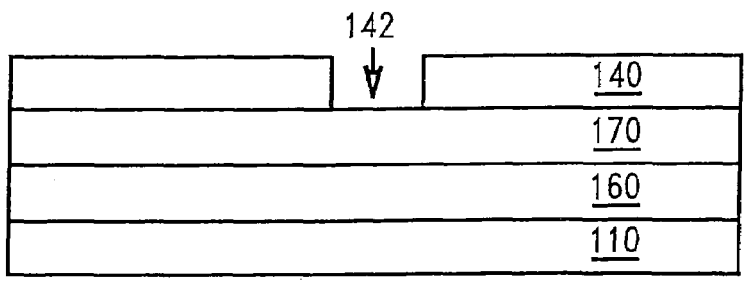
FIGS. 4A–4F are cross-sectional illustrations of process steps of the invention for forming substantially cylindrical wires.

Referring to FIGS. 4A–4G and 5A–5C, wherein the wafer being processed includes a multi-layer dielectric structure, substantially cylindrical wires may be formed in accordance with the invention having both substantially rounded bottoms and tops. As shown in FIG. 4A, a first intermetal dielectric layer 110 may be provided, followed by a second intermetal dielectric layer 160 thereover, and a third intermetal dielectric layer 170 over the second intermetal dielectric layer 160. A hard mask layer 140 may be deposited over the third intermetal dielectric layer 170 by known techniques. This hard mask layer 140, which may be composed of multiple dielectric or conductive layers as discussed previously, is patterned and anisotropically etched to form openings 142 in locations corresponding to where trench holes are to be etched into the multi-layer dielectric layers 110, 160, 170. As detailed above, opening 142 preferably has a width "w1" that is smaller in diameter than a width "w2" of trench opening 112 to be etched into the intermetal dielectric layers 110, 160, 170.

Figure 4B:
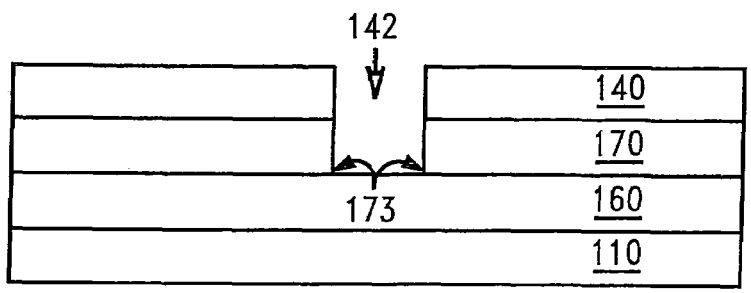
Figure 4C:
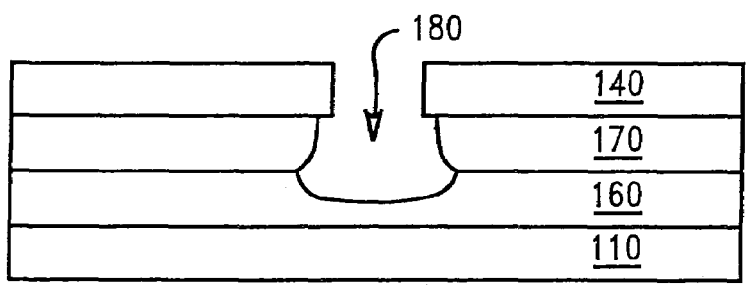
Figure 4D:
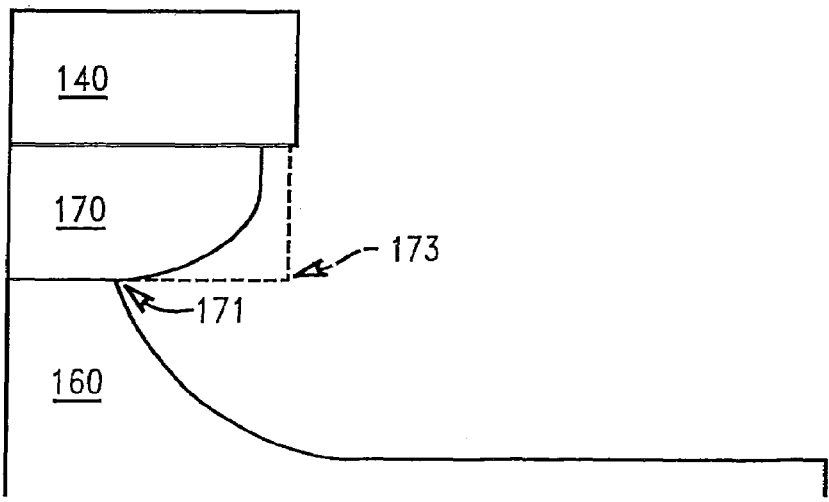
Figure 4E:
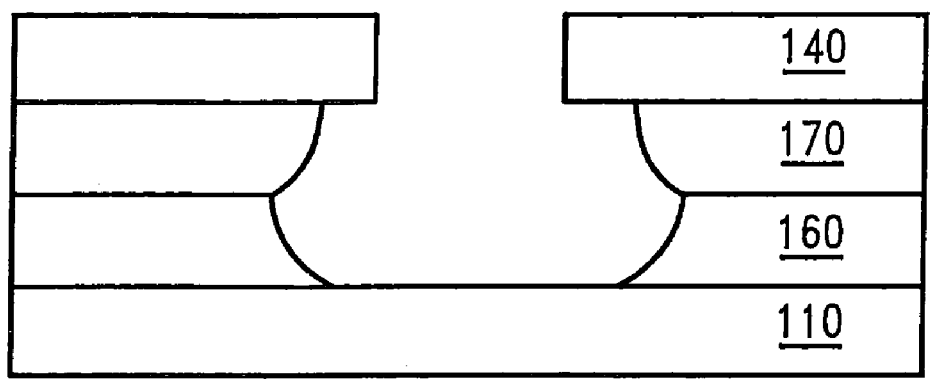
Figure 4F:
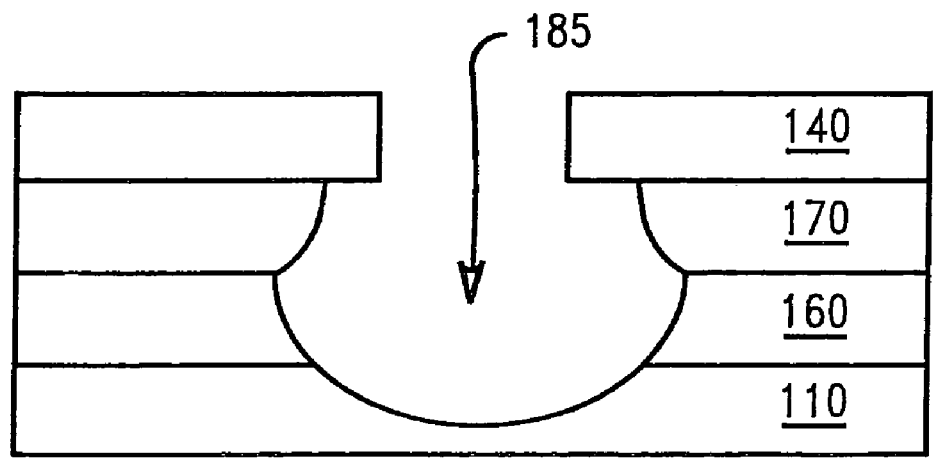

After the opening 142 is anisotropically etched into the hard mask, an etch process, with or without photoresist remaining on the wafer, is performed to etch the opening further such that it extends vertically into layer 170, as is shown in FIG. 4B. Multi intermetal dielectric layers 160 and 110 are then isotropically etched. In so doing, a critical feature is that an etchant is selected such that it selectively etches the intermetal dielectric layer 160 faster than the intermetal dielectric layers 110 and 170. Referring to FIG. 4C, the etch fronts through the dielectric layers 110, 160, and 170 progress such that a substantially cylindrical wire opening 180 is formed, in particular, after a portion of dielectric layers 160 and 170 have been etched. As the dielectric layer 160 etches faster than dielectric layer 170, the etch front will partially undercut 171 a bottom corner portion 173 of dielectric layer 170, as shown in the exploded view of FIG. 4D. That is, the original contours of layer 170 shown in FIG. 4B, also as is shown by the dashed line in FIG. 4D, are etched in a manner such that the bottom corners 173 of dielectric layer 170 are exposed to the etchant such that these corners are rounded-off, as shown in FIG. 4D. As this etch process proceeds, the lower interface of dielectric layers 160, 110 is reached (FIG. 4E), and then the etchant begins etching dielectric layer 110 (FIG. 4F). Due to dielectric layer 110 having a slower etch rate than dielectric layer 160, dielectric layer 110 is not undercut like that of dielectric layer 170 discussed above. The resultant structure from this etch step provides a substantially cylindrical trench opening 185 for forming a substantially cylindrical wire. An essential feature in forming the substantially round trench openings 185 is selecting intermetal dielectric layers having different etch rates that correspond to the above etching criteria of the invention.

For example, the third intermetal dielectric layer 170 may comprise a PECVD $SiO_2$ layer with about 0% phosphorous, the second intermetal dielectric layer 160 may comprise a phosphorous doped (PSG) $SiO_2$ layer doped at a highest dopant concentration of about 6% phosphorous, and the first intermetal dielectric layer 110 may comprise a $SiO_2$ layer doped at about 0% phosphorous. The opening 142 is formed in the hard mask layer 140, and then the third, second and first intermetal dielectric layers are sequentially etched using a DHF wet etch or a vapor HF etchant such that the third intermetal $SiO_2$ layer 170 with 0% phosphorous layer etches slowest, the second intermetal PSG $SiO_2$ layer doped at 6% phosphorous etches faster than the third intermetal layer, and the first PSG $SiO_2$ layer 110 doped at 0% phosphorous etches slower than the second intermetal dielectric PSG layer 160, such that the substantially round trench openings 185 are formed. Alternatively, the first, second and third intermetal dielectric layers may be doped with a dopant such that the second intermetal dielectric layer has the lowest concentration of dopant, i.e., dopant concentrations lower than both the first and third intermetal dielectric layers, whereby the lower doped concentration second intermetal dielectric layer etches faster than both the first and third intermetal dielectric layers. Still further, the intermetal dielectric layers 170, 160, 110 may comprise porous dielectric layers having the least porosity at the first and third intermetal dielectric layers and the most porosity at the second intermetal dielectric layer such that the layers are etched from slow-fast-slow as discussed above. For example, the multi-layer dielectric layers may comprise a third intermetal SiLK™ layer with 0% porosity, a second p-SiLK™ layer with 20% porosity and a third SiLK™ layer with 0% porosity, which are etched from slowest to fastest using an $O_2$ or $N_2$ plasma etch to form the substantially round trench openings 180.

The liner layer 130 may then be provided within the substantially round trench openings 180, and then remaining empty portions of the substantially round trench openings 180 are filled with metallization to form substantially cylindrical conductors/wires. Once metallization has been deposited to at least fill the substantially round trench openings 180, any excess metallization is removed from a surface of the hard mask layer 140. This hard mask layer 140 may be removed (as shown in FIG. 4C), or may not be removed, to provide the final structure with substantially cylindrical wires. This metallization process is similar to the methods employed to metallize the half-cylindrical wires discussed above.

Figure 5A:
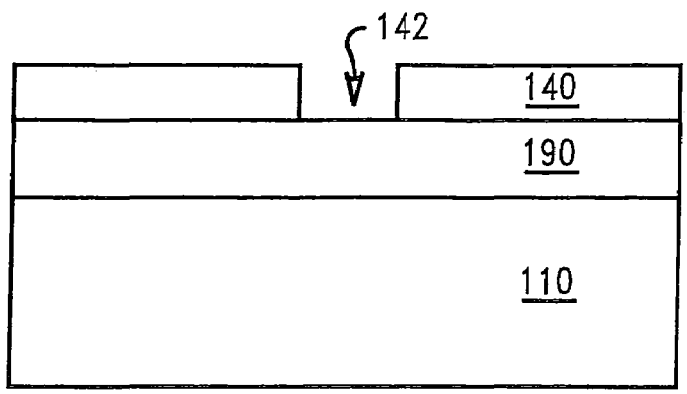
FIGS. 5A–5C are cross-sectional illustrations of process steps of the invention for forming cylindrical wires.
Figure 5B:
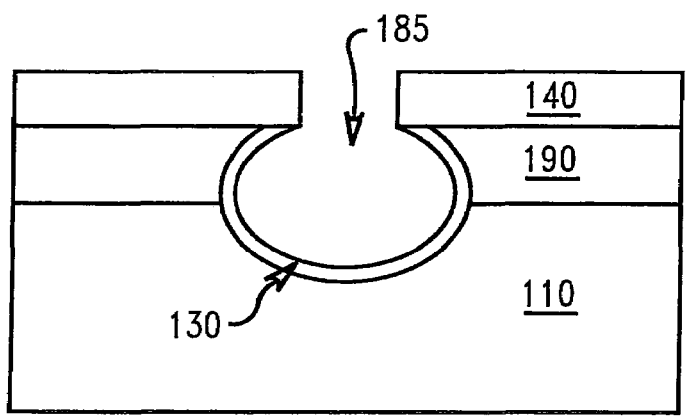
Figure 5C:
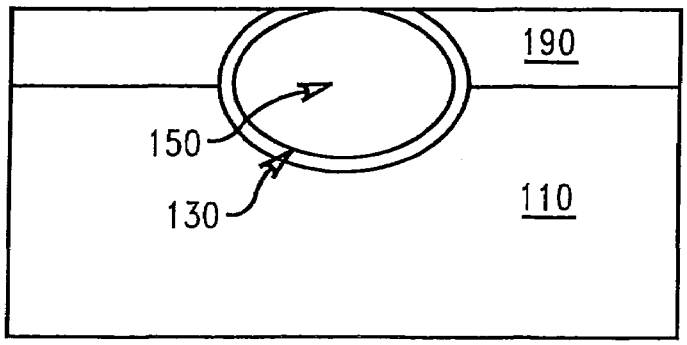

In accordance with the invention, the conductors may also be provided with a completely cylindrical shape. Referring to FIGS. 5A–5C, the multi-layer dielectric interconnect structure processed in accordance with the invention has a dielectric layer 110 with a graded dielectric layer 190 over a surface thereof. The graded dielectric layer 190 comprises a single layer having at least one constituent element of the material varied in concentration as the graded dielectric layer 190 is provided over the dielectric layer 110. Preferably, the at least one constituent element is varied throughout the deposited thickness of the material such that the graded dielectric layer 190 etches slowest at a top surface of the graded dielectric layer 190 and fastest at the bottom surface of the graded dielectric layer 190, which is in contact with the dielectric layer 110.

For example, dielectric layer 110 may comprise a PSG $SiO_2$ layer 110 doped at a single stoichiometry of 6% phosphorous. The graded dielectric layer 190 may then be provided over this 6% phosphorous doped PSG $SiO_2$ layer 110. In so doing, the concentration of phosphorous is varied throughout the process of depositing the graded dielectric layer 190 whereby the largest concentration of phosphorous (e.g. 6% phosphorous) is doped at a bottom surface thereof, which is in contact with the 6% phosphorous doped PSG $SiO_2$ layer 110, gradating to the smallest concentration of phosphorous (e.g. 0% phosphorous) at a top surface of the graded dielectric layer 190. Graded dielectric layer 190 may be deposited by PECVD using a parallel plate reactor with a pressure of about 10 Torr and temperature of about 400° C. During the PECVD deposition process, TEOS may be used as a source, oxygen as an oxidizer, and a triethylphophate (TEPO) gas as the phosphorous source. Thus, in forming the graded dielectric layer 190, the highest dopant concentrations of phosphorous in the PSG $SiO_2$ layer are deposited at the beginning of the deposition process, and then concentrations are ramped down by reducing the TEPO flow while the film is being deposited to the lowest concentrations of phosphorous at the end of the deposition process. In accordance with the invention, it should be appreciated that the graded dielectric layer 190 may also comprise a graded SiCOH layer having graded concentrations of carbon. Alternatively, the graded SiCOH layer may have graded levels of porosity during deposition of the SiCOH layer, whereby the lowest level of porosity (e.g. 0% porosity) is at a top surface of the graded SiCOH layer and the highest level of porosity (e.g. 40% porosity) is at a bottom surface of the graded SiCOH layer.

Once the graded dielectric layer 190 has been deposited over the dielectric layer 110, a hard mask 140 is provided over a surface of the graded dielectric layer. The hard mask is then patterned and etched to form openings 142 in locations corresponding to desired trenches, thereby exposing a portion of the top surface of the graded dielectric layer 190. These exposed portions of the graded dielectric layer 190 are then isotropically etched such that the etch rate monotonically increases as the etchant extends from the top surface to the bottom surface of the graded dielectric layer 190. Dielectric layer 110 is also etched to form substantially round trench openings 185 within the dielectric layers 190, 110. Preferably, the etch rate at the bottom of the graded dielectric layer 190 is equal to the etch rate of dielectric layer 110. For example, wherein the dielectric layers comprise a graded phosphorous doped PSG $SiO_2$ layer 190 over a 6% phosphorous doped PSG $SiO_2$ layer 110, these dielectric layers may be etched using DHF to form the substantially round trench openings 185. Alternatively, wherein the dielectric layers comprise a graded SiCOH layer 190 over a SiCOH layer 110, these dielectric layers may be etched using a PFC-oxygen isotropic plasma etch to form the substantially round trench openings 185.

Referring to FIG. 5B, liner layer 130 may then be provided within the substantially round trench openings 185, and then remaining empty portions of the substantially round trench openings 185 are filled with metallization to form cylindrical conductors/wires, similarly to the methods employed to metallize the half-cylindrical wires discussed above. Once metallization has been deposited to at least fill trench openings 185, any excess metallization is removed from a surface of the hard mask layer 140. This hard mask layer 140 may be removed (as shown in FIG. 5C), or may not be removed, to provide the final structure with cylindrical wires.

Alternatively, after the hard mask opening 142 is formed in FIG. 5A, a portion or substantially all the graded dielectric layer 190 exposed by opening 142 may be anisotropically etched for forming a structure similar to that as is shown in FIG. 4B. By initially etching the graded dielectric layer 190 to form a structure like that of FIG. 4B, the formation of a circular etch profile in the dielectric layers 190, 100 is enhanced since the lower dielectric layer 110 etches faster than the upper graded dielectric layer 190. Alternatively, the dielectric layer 110 may also comprise a graded dielectric layer with the highest etch rate material at the upper surface thereof for further enhancing the formation of the substantially round trench openings 185 of the invention for forming substantially round wires.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of forming substantially cylindrical conductors comprising:
   providing an intermetal dielectric layer;
   depositing a hard mask layer over said intermetal dielectric layer;
   etching an opening in said hard mask layer in a location corresponding to where a substantially half cylindrical wire is to be formed;
   isotropically etching said intermetal dielectric layer in a location corresponding to said opening at a substantially constant rate to form a substantially half cylindrical trench opening in said intermetal dielectric layer having dimensions larger in comparison to dimensions of said opening in said hard mask layer;
   filling said substantially half cylindrical trench opening with a high conductivity metal to form said substantially half cylindrical wire in said intermetal dielectric layer; and
   removing said hard mask layer and a portion of said high conductivity metal.

2. The method of claim 1 wherein said intermetal dielectric layer comprises a low-k intermetal dielectric layer.

3. The method of claim 1 wherein said intermetal dielectric layer comprises a $Si_wC_xO_yH_z$ based intermetal dielectric layer wherein w, x, y and z range from about 0–1, said $Si_wC_xO_yH_z$ based intermetal dielectric layer being isotropically etched using an etchant selected from the group consisting of an aqueous dilute HF and a vapor HF.

4. The method of claim 3 further including, prior to the step of isotropically etching said $Si_wC_xO_yH_z$ based intermetal dielectric layer, anisotropically etching said SiO2-based intermetal dielectric layer to obtain a substantially vertical trench profile having a desired trench depth of said substantially half cylindrical trench opening.

5. The method of claim 4 wherein said $Si_wC_xO_yH_z$ based intermetal dielectric layer is anisotropically etched by reactive ion etching using an etchant selected from the group consisting of perfluorocarbon-based etchant and a hydrofluorocarbon-based etchant.

6. The method of claim 1 wherein said intermetal dielectric layer comprises an organic polymer intermetal dielectric layer, said organic polymer intermetal dielectric layer is isotropically etched using an etchant selected from the group consisting of an $H_2$, $N_2$, $O_2$, He and Ar plasma.

7. The method of claim 6 further including, prior to the step of isotropically etching said organic polymer intermetal dielectric layer, anisotropically etching said organic polymer intermetal dielectric layer to obtain a substantially vertical trench profile having a desired trench depth of said substantially half cylindrical trench opening.

8. The method of claim 7 wherein said intermetal dielectric layer comprises an organic polymer intermetal dielectric layer, said organic polymer intermetal dielectric layer is isotropically etched by reactive ion etching using an etchant selected from the group consisting of an $H_2$, $N_2$, $O_2$, He and Ar plasma.

9. The method of claim 1 wherein said opening in said hard mask layer has a width "w1" and said substantially half cylindrical trench opening has a depth "d" and a largest width "w2", said largest width "w2" being a function of said opening in said hard mask layer represented as "w2"="w1"+(2)(d).

10. The method of claim 1 further including depositing a conductive liner layer within said substantially half cylindrical trench opening prior to filling said substantially half cylindrical trench opening with said high conductivity metal.

11. The method of claim 1 further including the steps of;
   removing a portion of said intermetal dielectric layer at least in a location surrounding said substantially half cylindrical wire, thereby exposing a top surface of said substantially half cylindrical wire;
   etching said exposed top portion of said substantially half cylindrical wire to transform said substantially half cylindrical wire to a substantially cylindrical wire; and
   depositing additional dielectric material to at least encapsulate said substantially cylindrical wire.

12. A method of forming substantially cylindrical conductors comprising:

providing a first intermetal dielectric layer;

providing a second intermetal dielectric layer over said first intermetal dielectric layer;

providing a third intermetal dielectric layer over said second intermetal dielectric layer depositing a hard mask layer over said third intermetal dielectric layer;

etching an opening in said hard mask layer in a location corresponding to where a substantially cylindrical wire is to be formed;

sequentially etching said third, said second and said first intermetal dielectric layers to form a substantially cylindrical trench opening traversing through said third, said second intermetal dielectric layer and extending into said first intermetal dielectric layer, said second intermetal dielectric layer selectively etching faster than said first and third intermetal dielectric layers so that said etch front partially undercuts bottom corner portions of said second intermetal dielectric layer for forming said substantially cylindrical trench opening, said substantially cylindrical trench opening having dimensions larger in comparison to dimensions of said opening in said hard mask layer; and filling said substantially cylindrical trench opening with a high conductivity metal to form said substantially cylindrical wire in said second and first intermetal dielectric layers.

13. The method of claim 12 wherein said first, second and third intermetal dielectric layers are doped with dopants at varying concentrations, said second intermetal dielectric layer being doped with a concentration of dopants that allows said second intermetal dielectric layer to etch faster than said first and third intermetal dielectric layers for forming said substantially cylindrical trench opening.

14. The method of claim 12 wherein said first, second and third intermetal dielectric layers comprise first, second and third porous intermetal dielectric layers having varying amounts of porosity, said second intermetal dielectric layer having a highest amount of porosity such that said second intermetal dielectric layer etches faster than said first and third intermetal dielectric layers for forming said substantially cylindrical trench opening.

15. The method of claim 12 wherein said second dielectric layer comprises a first graded dielectric layer having at least one constituent element thereof varied in concentration as said first graded dielectric layer is deposited over said first dielectric layer, said at least one constituent element being varied in a manner that allows said first graded dielectric layer to etch slowest at a top surface of said first graded dielectric layer and fastest at a bottom surface of said first graded dielectric layer, for forming said substantially cylindrical trench opening.

16. The method of claim 15 wherein said first dielectric layer comprises a second graded dielectric layer having at least one constituent element thereof varied in concentration in a manner that allows said second graded dielectric layer etch fastest at a top surface, which is in contact with said first graded dielectric layer, and slowest at a bottom surface of said second graded dielectric layer, for forming said substantially cylindrical trench opening.

17. A conductive interconnect structure for preventing cracks in a dielectric layer on a substrate comprising:

at least a first intermetal dielectric layer;

at least a second intermetal dielectric layer over said first intermetal dielectric layer;

a substantially cylindrical trench opening traversing through said at least second intermetal dielectric layer and extending into said at least first intermetal dielectric layer;

a high conductivity metal filling said substantially cylindrical trench opening to form a substantially cylindrical wire residing in both said at least first and said at least second intermetal dielectric layers, said substantially cylindrical wire substantially avoiding propagation points for starting cracks in said at least first intermetal dielectric layer.

\* \* \* \* \*